United States Patent
Ko et al.

(10) Patent No.: US 9,819,321 B2
(45) Date of Patent: Nov. 14, 2017

(54) METHOD AND APPARATUS FOR AUTOMATICALLY CONTROLLING GAIN BASED ON SENSITIVITY OF MICROPHONE IN ELECTRONIC DEVICE

(71) Applicant: Samsung Electronics Co., Ltd., Gyeonggi-do (KR)

(72) Inventors: Sunghwan Ko, Seoul (KR); Nakjin Choi, Gyeonggi-do (KR); Sangju Lee, Gyeonggi-do (KR); Juhee Chang, Gyeonggi-do (KR); Sunghoon Jeong, Gyeonggi-do (KR); Yoongu Choi, Gyeonggi-do (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 15 days.

(21) Appl. No.: 14/628,526

(22) Filed: Feb. 23, 2015

(65) Prior Publication Data

US 2015/0244337 A1 Aug. 27, 2015

(30) Foreign Application Priority Data

Feb. 21, 2014 (KR) .................. 10-2014-0020134

(51) Int. Cl.
| H04R 29/00 | (2006.01) |
| H03G 3/04 | (2006.01) |
| H03G 3/30 | (2006.01) |
| H03G 3/32 | (2006.01) |

(52) U.S. Cl.
CPC ............. *H03G 3/04* (2013.01); *H03G 3/3005* (2013.01); *H03G 3/32* (2013.01); *H04R 29/004* (2013.01); *H04R 2420/09* (2013.01)

(58) Field of Classification Search
CPC .............................. H04R 29/00; H04R 29/004
USPC ....................................................... 381/56–58
See application file for complete search history.

(56) References Cited

U.S. PATENT DOCUMENTS

| 5,852,769 | A * | 12/1998 | Ahmed | ............... H04M 1/6008 381/109 |
| 6,760,453 | B1 * | 7/2004 | Banno | .................. H03G 3/3089 381/104 |
| 8,773,257 | B2 * | 7/2014 | Yodfat | ............... A61M 5/14248 340/384.6 |
| 2002/0146136 | A1 * | 10/2002 | Carter, Jr. | ............ H04R 29/001 381/59 |
| 2003/0083591 | A1 * | 5/2003 | Edwards | ................ A61B 5/121 600/559 |
| 2005/0244014 | A1 * | 11/2005 | Elko | ....................... G01K 11/22 381/58 |
| 2006/0290481 | A1 * | 12/2006 | Kitazawa | ............... H04R 3/002 340/426.34 |

(Continued)

FOREIGN PATENT DOCUMENTS

KR 20-0000084 8/2000

*Primary Examiner* — Katherine Faley

(57) ABSTRACT

The present disclosure relates to a method and an apparatus for automatically controlling a gain in an electronic device based on a sensitivity of microphone. The method according to an embodiment of the present disclosure includes outputting a reference audio to a speaker and obtaining a sound signal output by the speaker through a microphone, comparing a parameter of the obtained sound signal with a stored parameter, and adjusting a gain of the microphone based on a result of the comparing.

8 Claims, 8 Drawing Sheets

(56) References Cited

U.S. PATENT DOCUMENTS

| | | | |
|---|---|---|---|
| 2007/0086594 A1* | 4/2007 | Amanuma | G01D 1/18 |
| | | | 381/56 |
| 2011/0142255 A1* | 6/2011 | Tanaka | H03G 5/165 |
| | | | 381/94.1 |
| 2014/0003635 A1* | 1/2014 | Mohammad | G10K 11/16 |
| | | | 381/306 |

* cited by examiner

METHOD AND APPARATUS FOR AUTOMATICALLY CONTROLLING GAIN BASED ON SENSITIVITY OF MICROPHONE IN ELECTRONIC DEVICE

CROSS-REFERENCE TO RELATED APPLICATION(S) AND CLAIM OF PRIORITY

The present application is related to and claims the benefit under 35 U.S.C. §119(a) of a Korean patent application filed on Feb. 21, 2014 in the Korean Intellectual Property Office and assigned Serial No. 10-2014-0020134, the entire disclosure of which is hereby incorporated by reference.

TECHNICAL FIELD

The present disclosure relates to a method and an apparatus for automatically controlling a gain based on a sensitivity of microphone in an electronic device.

BACKGROUND

According to the development in technologies of electronic device, recording or communication has become to perform in various types of electronic device. As the technologies of electronic device for processing a voice or sound is developed, the electronic device can process a voice or sound independently or use a separate external microphone. The technical development has been made in an external microphone which can be used in the electronic device and accordingly various types of external microphones are being used.

Conventional electronic devices are provided without considering characteristics of various external microphones. Namely, the electronic devices are processed according to basically set gains. In some electronic devices having a function of processing a sensitivity or gain, a user can process a voice or sound according to the gain set by a user. The processing of a voice or sound may correspond to transmitting or recording a voice or sound in a communication.

Like this, the external microphones currently available in the market have various sensitivities or gains according to various types of microphones. In a case that an electronic device is used by connecting with external microphones having different sensitivities, an electronic device having no function of adjusting sensitivity can process a voice or sound only with a basic setting value, and thereby a user cannot obtain a desired quality of sound. Even with an electronic device having a function of adjusting sensitivity, a user could not obtain a desired quality if the user doesn't know the characteristics of microphone or a method of operating the microphone. Therefore, a voice or sound processed by the electronic device can be frequently too small or large.

SUMMARY

To address the above-discussed deficiencies, it is a primary to provide a method and an apparatus for adaptively processing a voice or sound according to characteristics of microphone in an electronic device Another aspect of the present disclosure is to provide a method and an apparatus for adjusting a gain of voice or sound by automatically detecting characteristics of microphone in an electronic device.

Another aspect of the present disclosure is to provide a method and an apparatus for providing a voice or sound desired by a user by figuring out characteristics of microphone in an electronic device.

Another aspect of the present disclosure is to provide a method and an apparatus for improving a quality of voice or sound in an electronic device using a microphone.

In accordance with an aspect of the present disclosure, a method for automatically controlling a gain based on a sensitivity of microphone in an electronic device is disclosed. The method includes outputting a reference audio to a speaker and obtaining a sound signal output by the speaker through a microphone, comparing a parameter of the obtained sound signal with a stored parameter, and adjusting a gain of the microphone based on the comparing.

In accordance with another aspect of the present disclosure, an apparatus for automatically controlling a gain based on a sensitivity of microphone in an electronic device is disclosed. The apparatus includes a speaker configured to output a sound; a microphone configured to obtain a signal output by the speaker; a memory configured to store a reference audio and a basic parameter; and a processor configured to control the reference audio to be output to the speaker, to compare a parameter of sound signal with the basic parameter by obtaining a signal output by the speaker through the microphone, and to adjust a gain of the microphone based on the comparison.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

Figure 1:
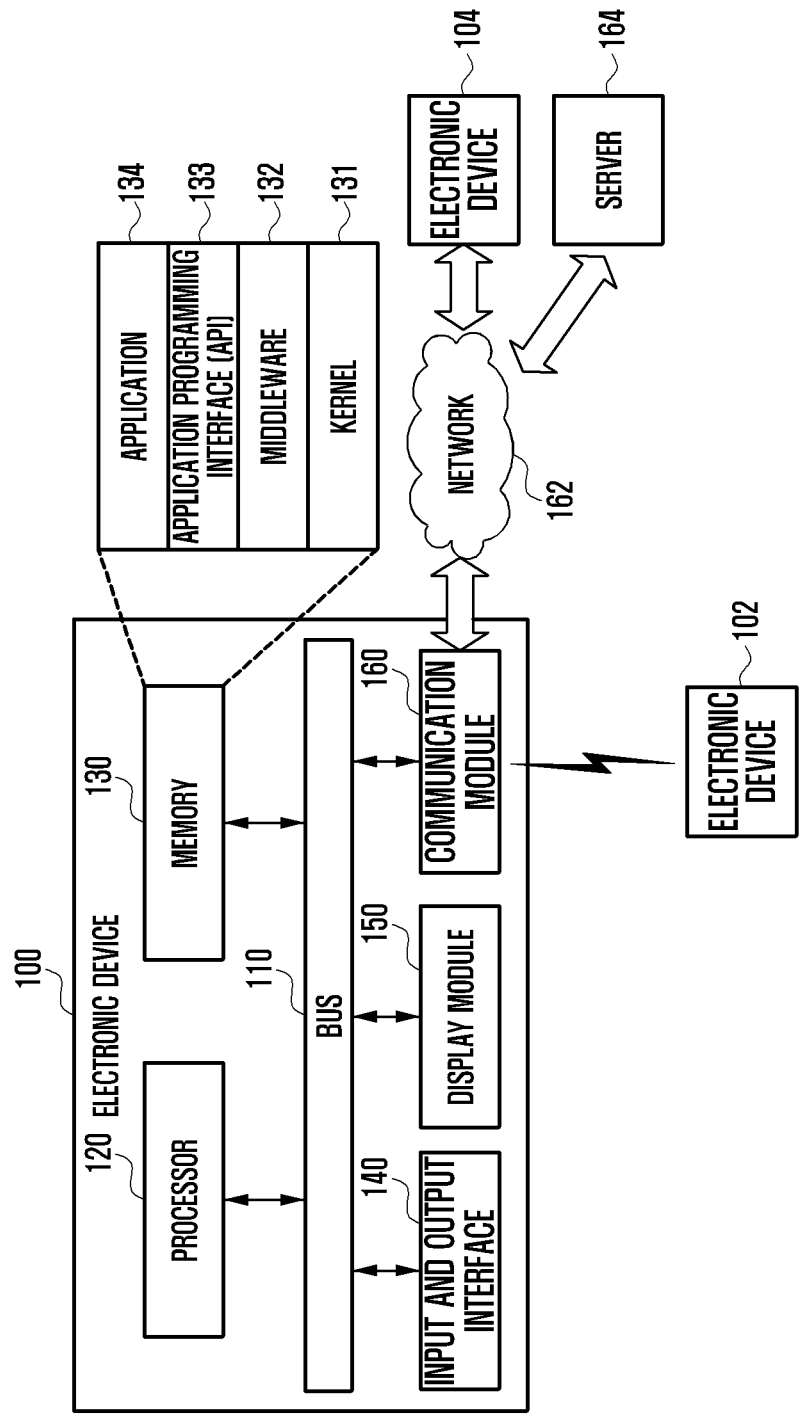
FIG. 1 is a block diagram illustrating a configuration of an electronic device according to an embodiment of the present disclosure.

FIGS. 1 through 8, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device. The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

The expressions such as "include" and "may include" which may be used in the present disclosure denote the presence of the disclosed functions, operations, and constituent elements and do not limit one or more additional functions, operations, and constituent elements. In the present disclosure, the terms such as "include" and/or "have" may be construed to denote a certain characteristic, number, step, operation, constituent element, component or a combination thereof, but may not be construed to exclude the existence of or a possibility of addition of one or more other characteristics, numbers, steps, operations, constituent elements, components or combinations thereof.

Furthermore, in the present disclosure, the expression "and/or" includes any and all combinations of the associated listed words. For example, the expression "A and/or B" may include A, may include B, or may include both A and B.

In the present disclosure, expressions including ordinal numbers, such as "first" and "second," etc., may modify various elements. However, such elements are not limited by the above expressions. For example, the above expressions do not limit the sequence and/or importance of the elements. The above expressions are used merely for the purpose to distinguish an element from the other elements. For example, a first user device and a second user device indicate different user devices although both of them are user devices. For example, a first element could be termed a second element, and similarly, a second element could be also termed a first element without departing from the scope of the present disclosure.

In the case where a component is referred to as being "connected" or "accessed" to other component, it should be understood that not only the component is directly connected or accessed to the other component, but also there may exist another component between them. Meanwhile, in the case where a component is referred to as being "directly connected" or "directly accessed" to other component, it should be understood that there is no component there between. The terms used in the present disclosure are only used to describe specific various embodiments, and are not intended to limit the present disclosure. As used herein, the singular forms are intended to include the plural forms as well, unless the context clearly indicates otherwise. Singular forms are intended to include plural forms unless the context clearly indicates otherwise.

An electronic device according to the present disclosure may include a communication function and an external microphone. For example, the device corresponds to a combination of at least one of a smartphone, a tablet Personal Computer (PC), a mobile phone, a video phone, an e-book reader, a desktop PC, a laptop PC, a netbook computer, a Personal Digital Assistant (PDA), a Portable Multimedia Player (PMP), a digital audio player, a mobile medical device, an electronic bracelet, an electronic necklace, an electronic accessory, a camera, a wearable device, an electronic clock, a wrist watch, home appliances (for example, an air-conditioner, vacuum, an oven, a microwave, a washing machine, an air cleaner, and the like), an artificial intelligence robot, a TeleVision (TV), a Digital Video Disk (DVD) player, an audio device, various medical devices (for example, Magnetic Resonance Angiography (MRA), Magnetic Resonance Imaging (MRI), Computed Tomography (CT), a scanning machine, a ultrasonic wave device, or the like), a navigation device, a Global Positioning System (GPS) receiver, an Event Data Recorder (EDR), a Flight Data Recorder (FDR), a set-top box, a TV box (for example, Samsung HomeSync™, Apple TV™, or Google TV™), an electronic dictionary, vehicle infotainment device, an electronic equipment for a ship (for example, navigation equipment for a ship, gyrocompass, or the like), avionics, a security device, electronic clothes, an electronic key, a camcorder, game consoles, a Head-Mounted Display (HMD), a flat panel display device, an electronic frame, an electronic album, furniture or a portion of a building/structure that includes a communication function, an electronic board, an electronic signature receiving device, a projector, and the like. It is obvious to those skilled in the art that the electronic device according to the present disclosure is not limited to the aforementioned devices.

FIG. 1 is a block diagram illustrating a configuration of an electronic device according to an embodiment of the present disclosure.

Referring to FIG. 1, the electronic device 100 may include a bus 110, a processor 120, a memory 130, a user input module 140, a display module 150, a communication module 160, and other similar and/or suitable components.

The bus 110 may be a circuit which interconnects the above-described elements and delivers a communication (e.g., a control message) between the above-described elements.

The processor 120 may receive commands from the above-described other elements (e.g., the memory 130, the user input module 140, the display module 150, the communication module 160, etc.) through the bus 110, may interpret the received commands, and may execute calculation or data processing according to the interpreted commands.

The memory 130 may store commands or data received from the processor 120 or other elements (e.g., the user input module 140, the display module 150, the communication module 160, etc.) or generated by the processor 120 or the other elements. The memory 130 may include programming modules, such as a kernel 131, middleware 132, an Application Programming Interface (API) 133, an application 134, and the like. Each of the above-described programming modules may be implemented in software, firmware, hardware, or a combination of two or more thereof.

Further, the memory 130 can store control data and information of basic audio signals and gains in order to process a control operation according to the present disclosure.

The kernel 131 may control or manage system resources (e.g., the bus 110, the processor 120, the memory 130, etc.) used to execute operations or functions implemented by other programming modules (e.g., the middleware 132, the API 133, and the application 134). Also, the kernel 131 may provide an interface capable of accessing and controlling or managing the individual elements of the electronic device 100 by using the middleware 132, the API 133, or the application 134.

The middleware 132 may serve to go between the API 133 or the application 134 and the kernel 131 in such a manner that the API 133 or the application 134 communicates with the kernel 131 and exchanges data therewith. Also, in relation to work requests received from one or more applications 134 and/or the middleware 132, for example, may perform load balancing of the work requests by using a method of assigning a priority, in which system resources (e.g., the bus 110, the processor 120, the memory 130, etc.) of the electronic device 100 can be used, to at least one of the one or more applications 134.

The API 133 is an interface through which the application 134 is capable of controlling a function provided by the kernel 131 or the middleware 132, and may include, for example, at least one interface or function for file control, window control, image processing, character control, or the like.

The user input module 140, for example, may receive a command or data as input from a user, and may deliver the received command or data to the processor 120 or the memory 130 through the bus 110. The display module 150 may display a video, an image, data, or the like to the user.

The communication module 160 may connect communication between another electronic device 102 and the electronic device 100. The communication module 160 may support a predetermined short-range communication protocol (e.g., Wi-Fi, BlueTooth (BT), and Near Field Communication (NFC)), or predetermined network communication 162 (e.g., the Internet, a Local Area Network (LAN), a Wide Area Network (WAN), a telecommunication network, a cellular network, a satellite network, a Plain Old Telephone Service (POTS), or the like). Each of the electronic devices 102 and 104 may be a device which is identical (e.g., of an identical type) to or different (e.g., of a different type) from the electronic device 100. Further, the communication module 160 may connect communication between a server 164 and the electronic device 100 via the network 162.

Figure 2:
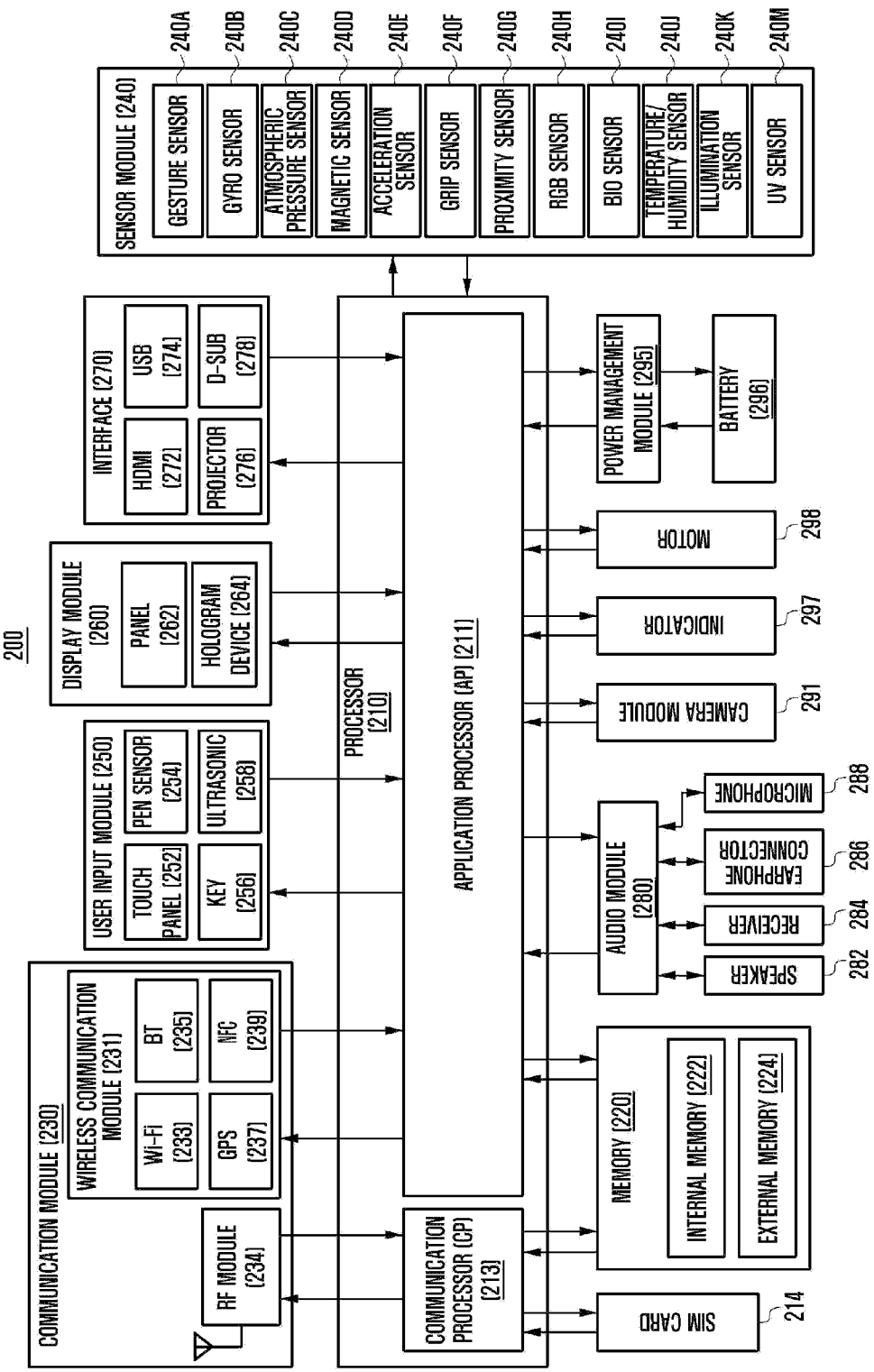
FIG. 2 is a block diagram illustrating a configuration of hardware 200 according to an embodiment of the present disclosure.

FIG. 2 is a block diagram illustrating a configuration of hardware 200 according to an embodiment of the present disclosure.

The hardware 200 may be, for example, the electronic device 100 illustrated in FIG. 1. Referring to FIG. 2, the hardware 200 may include one or more processors 210, a Subscriber Identification Module (SIM) card 214, a memory 220, a communication module 230, a sensor module 240, a user input module 250, a display module 260, an interface 270, an audio coder/decoder (codec) 280, a camera module 291, a power management module 295, a battery 296, an indicator 297, a motor 298 and any other similar and/or suitable components.

The processor 210 (e.g., the processor 120) may include one or more Application Processors (APs) 211, or one or more Communication Processors (CPs) 213. The processor 210 may be, for example, the processor 120 illustrated in FIG. 1. The AP 211 and the CP 213 are illustrated as being included in the processor 210 in FIG. 2, but may be included in different Integrated Circuit (IC) packages, respectively. According to an embodiment of the present disclosure, the AP 211 and the CP 213 may be included in one IC package.

The AP 211 may execute an Operating System (OS) or an application program, and thereby may control multiple hardware or software elements connected to the AP 211 and may perform processing of and arithmetic operations on various data including multimedia data. The AP 211 may be implemented by, for example, a System on Chip (SoC). According to an embodiment of the present disclosure, the processor 210 may further include a Graphical Processing Unit (GPU) (not illustrated).

The CP 213 may manage a data line and may convert a communication protocol in the case of communication between the electronic device (e.g., the electronic device 100) including the hardware 200 and different electronic devices connected to the electronic device through the network. The CP 213 may be implemented by, for example, a SoC. According to an embodiment of the present disclosure, the CP 213 may perform at least some of multimedia control functions. The CP 213, for example, may distinguish and authenticate a terminal in a communication network by using a subscriber identification module (e.g., the SIM card 214). Also, the CP 213 may provide the user with services, such as a voice telephony call, a video telephony call, a text message, packet data, and the like.

Further, the CP 213 may control the transmission and reception of data by the communication module 230. In FIG. 2, the elements such as the CP 213, the power management module 295, the memory 220, and the like are illustrated as elements separate from the AP 211. However, according to an embodiment of the present disclosure, the AP 211 may include at least some (e.g., the CP 213) of the above-described elements.

According to an embodiment of the present disclosure, the AP 211 or the CP 213 may load, to a volatile memory, a command or data received from at least one of a non-volatile memory and other elements connected to each of the AP 211 and the CP 213, and may process the loaded command or data. Also, the AP 211 or the CP 213 may store, in a non-volatile memory, data received from or generated by at least one of the other elements.

The SIM card 214 may be a card implementing a subscriber identification module, and may be inserted into a slot formed in a particular portion of the electronic device 100. The SIM card 214 may include unique identification information (e.g., Integrated Circuit Card IDentifier (ICCID)) or subscriber information (e.g., International Mobile Subscriber Identity (IMSI)).

The memory 220 may include an internal memory 222 and an external memory 224. The memory 220 may be, for example, the memory 130 illustrated in FIG. 1. The internal memory 222 may include, for example, at least one of a volatile memory (e.g., a Dynamic RAM (DRAM), a Static RAM (SRAM), a Synchronous Dynamic RAM (SDRAM), etc.), and a non-volatile memory (e.g., a One Time Programmable ROM (OTPROM), a Programmable ROM (PROM), an Erasable and Programmable ROM (EPROM), an Electrically Erasable and Programmable ROM (EEPROM), a mask ROM, a flash ROM, a Not AND (NAND) flash memory, a Not OR (NOR) flash memory, etc.). According to an embodiment of the present disclosure, the internal memory 222 may be in the form of a Solid State Drive (SSD). The external memory 224 may further include a flash drive, for example, a Compact Flash (CF), a Secure Digital (SD), a Micro-Secure Digital (Micro-SD), a Mini-Secure Digital (Mini-SD), an extreme Digital (xD), a memory stick, or the like.

The communication module 230 may include a wireless communication module 231 or a Radio Frequency (RF) module 234. The communication module 230 may be, for example, the communication module 160 illustrated in FIG. 1. The wireless communication module 231 may include, for example, a Wi-Fi part 233, a BT part 235, a GPS part 237, or a NFC part 239. For example, the wireless communication module 231 may provide a wireless communication function by using a radio frequency. Additionally or alternatively, the wireless communication module 231 may include a network interface (e.g., a LAN card), a modulator/demodulator (modem), or the like for connecting the hardware 200 to a network (e.g., the Internet, a LAN, a WAN, a telecommunication network, a cellular network, a satellite network, a POTS, or the like).

The RF module 234 may be used for transmission and reception of data, for example, transmission and reception of RF signals or called electronic signals. Although not illustrated, the RF unit 234 may include, for example, a transceiver, a Power Amplifier Module (PAM), a frequency filter, a Low Noise Amplifier (LNA), or the like. Also, the RF module 234 may further include a component for transmitting and receiving electromagnetic waves in a free space in a wireless communication, for example, a conductor, a conductive wire, or the like.

The sensor module 240 may include, for example, at least one of a gesture sensor 240A, a gyro sensor 240B, an atmospheric pressure sensor 240C, a magnetic sensor 240D, an acceleration sensor 240E, a grip sensor 240F, a proximity sensor 240G, a Red, Green and Blue (RGB) sensor 240H, a biometric sensor 240I, a temperature/humidity sensor 240J, an illuminance sensor 240K, and a Ultra Violet (UV) sensor 240M. The sensor module 240 may measure a physical quantity or may sense an operating state of the electronic device 100, and may convert the measured or sensed information to an electrical signal. Additionally/alternatively, the sensor module 240 may include, for example, an E-nose sensor (not illustrated), an ElectroMyoGraphy (EMG) sensor (not illustrated), an ElectroEncephaloGram (EEG) sensor (not illustrated), an ElectroCardioGram (ECG) sensor (not illustrated), a fingerprint sensor (not illustrated), and the like. Additionally or alternatively, the sensor module 240 may include, for example, an E-nose sensor (not illustrated), an EMG sensor (not illustrated), an EEG sensor (not illustrated), an ECG sensor (not illustrated), a fingerprint sensor, and the like. The sensor module 240 may further include a control circuit (not illustrated) for controlling one or more sensors included therein.

The user input module 250 may include a touch panel 252, a pen sensor 254 (e.g., a digital pen sensor), keys 256, and an ultrasonic input unit 258. The user input module 250 may be, for example, the user input module 140 illustrated in FIG. 1. The touch panel 252 may recognize a touch input in at least one of, for example, a capacitive scheme, a resistive scheme, an infrared scheme, and an acoustic wave scheme. Also, the touch panel 252 may further include a controller (not illustrated). In the capacitive type, the touch panel 252 is capable of recognizing proximity as well as a direct touch. The touch panel 252 may further include a tactile layer (not illustrated). In this event, the touch panel 252 may provide a tactile response to the user.

The pen sensor 254 (e.g., a digital pen sensor), for example, may be implemented by using a method identical or similar to a method of receiving a touch input from the user, or by using a separate sheet for recognition. For example, a key pad or a touch key may be used as the keys 256. The ultrasonic input unit 258 enables the terminal to sense a sound wave by using a microphone (e.g., a microphone 288) of the terminal through a pen generating an ultrasonic signal, and to identify data. The ultrasonic input unit 258 is capable of wireless recognition. According to an embodiment of the present disclosure, the hardware 200 may receive a user input from an external device (e.g., a network, a computer, or a server), which is connected to the communication module 230, through the communication module 230.

The display module 260 may include a panel 262 or a hologram 264. The display module 260 may be, for example, the display module 150 illustrated in FIG. 1. The panel 262 may be, for example, a Liquid Crystal Display (LCD) and an Active Matrix Organic Light Emitting Diode (AM-OLED) display, and the like. The panel 262 may be implemented so as to be, for example, flexible, transparent, or wearable. The panel 262 may include the touch panel 252 and one module. The hologram 264 may display a three-dimensional image in the air by using interference of light. According to an embodiment of the present disclosure, the display module 260 may further include a control circuit for controlling the panel 262 or the hologram 264.

The interface 270 may include, for example, a High-Definition Multimedia Interface (HDMI) 272, a Universal Serial Bus (USB) 274, a projector 276, and a D-subminiature (D-sub) 278. Additionally or alternatively, the interface 270 may include, for example, SD/Multi-Media Card (MMC) (not illustrated) or Infrared Data Association (IrDA) (not illustrated). Further, the interface 270 may include a 3.5ø jack (not shown) to connect with an external microphone.

The audio codec 280 converts a voice and an electrical signal bi-directionally. For example, the audio codec 280 can convert voice information input or output through a speaker 282, receiver 284, earphone connector 286, or microphone 288. Here, the earphone connector 286 may be one which can be driven together with a receiver and a microphone. The earphone connector 286 can be configured with a 3.5ø jack. The earphone connector 286 may connect an external speaker and an external microphone at the same time or only the external microphone. Further, the microphone 288 may be an internal microphone installed in the electronic device 200.

The camera module 291 may capture an image and a moving image. According to an embodiment, the camera module 291 may include one or more image sensors (e.g., a front lens or a back lens), an Image Signal Processor (ISP) (not illustrated), and a flash LED (not illustrated).

The power management module 295 may manage power of the hardware 200. Although not illustrated, the power management module 295 may include, for example, a Power Management Integrated Circuit (PMIC), a charger Integrated Circuit (IC), or a battery fuel gauge.

The PMIC may be mounted to, for example, an IC or a SoC semiconductor. Charging methods may be classified into a wired charging method and a wireless charging method. The charger IC may charge a battery, and may prevent an overvoltage or an overcurrent from a charger to the battery. According to an embodiment of the present disclosure, the charger IC may include a charger IC for at least one of the wired charging method and the wireless charging method. Examples of the wireless charging method may include a magnetic resonance method, a magnetic induction method, an electromagnetic method, and the like. Additional circuits (e.g., a coil loop, a resonance circuit, a rectifier, etc.) for wireless charging may be added in order to perform the wireless charging.

The battery fuel gauge may measure, for example, a residual quantity of the battery 296, or a voltage, a current or a temperature during the charging. The battery 296 may supply power by generating electricity, and may be, for example, a rechargeable battery.

The indicator 297 may indicate particular states of the hardware 200 or a part (e.g., the AP 211) of the hardware 200, for example, a booting state, a message state, a charging state and the like. The motor 298 may convert an electrical signal into a mechanical vibration. The processor 210 may control the sensor module 240.

Although not illustrated, the hardware 200 may include a processing unit (e.g., a GPU) for supporting a module TV. The processing unit for supporting a module TV may process media data according to standards such as, for example, Digital Multimedia Broadcasting (DMB), Digital Video Broadcasting (DVB), media flow, and the like. Each of the above-described elements of the hardware 200 according to an embodiment of the present disclosure may include one or more components, and the name of the relevant element may change depending on the type of electronic device. The hardware 200 according to an embodiment of the present disclosure may include at least one of the above-described elements. Some of the above-described elements may be omitted from the hardware 200, or the hardware 200 may further include additional elements. Also, some of the elements of the hardware 200 according to an embodiment of the present disclosure may be combined into one entity, which may perform functions identical to those of the relevant elements before the combination.

The term "module" used in the present disclosure may refer to, for example, a unit including one or more combinations of hardware, software, and firmware. The "module" may be interchangeable with a term, such as "unit," "logic," "logical block," "component," "circuit," or the like. The "module" may be a minimum unit of a component formed as one body or a part thereof. The "module" may be a minimum unit for performing one or more functions or a part thereof. The "module" may be implemented mechanically or electronically. For example, the "module" according to an embodiment of the present disclosure may include at least one of an Application-Specific Integrated Circuit (ASIC) chip, a Field-Programmable Gate Array (FPGA), and a programmable-logic device for performing certain operations which have been known or are to be developed in the future.

Figure 3:
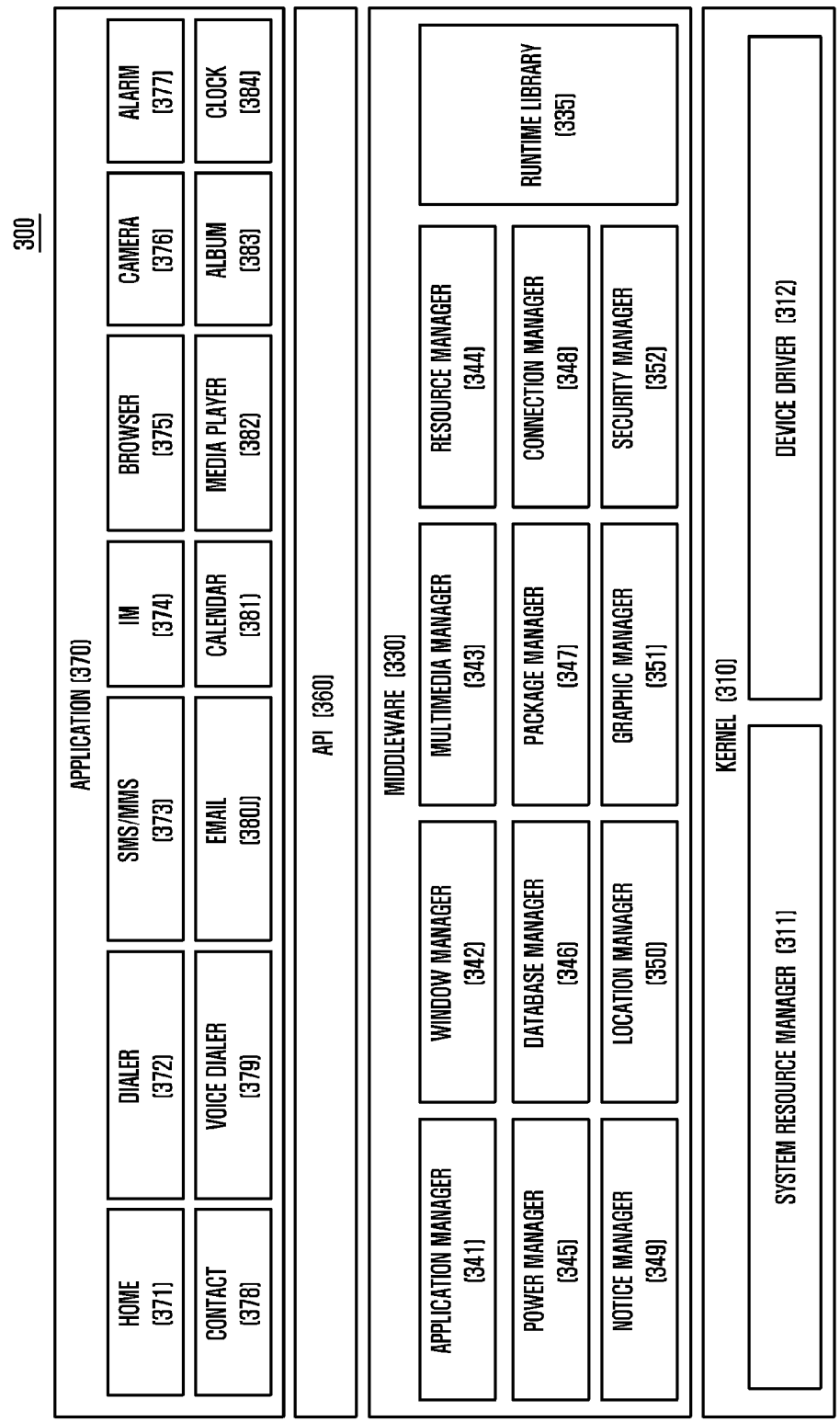
FIG. 3 is a block diagram illustrating a configuration of a programming module 300 according to an embodiment of the present disclosure.

FIG. 3 is a block diagram illustrating a configuration of a programming module 300 according to an embodiment of the present disclosure.

The programming module 300 may be included (or stored) in the electronic device 100 (e.g., the memory 130) or may be included (or stored) in the electronic device 200 (e.g., the memory 230) illustrated in FIG. 1. At least a part of the programming module 300 may be implemented in software, firmware, hardware, or a combination of two or more thereof. The programming module 300 may be implemented in hardware (e.g., the hardware 200), and may include an OS controlling resources related to an electronic device (e.g., the electronic device 100) and/or various applications (e.g., an application 370) executed in the OS. For example, the OS may be Android, iOS, Windows, Symbian, Tizen, Bada, and the like.

Referring to FIG. 3, the programming module 300 may include a kernel 310, a middleware 330, an API 360, and/or the application 370.

The kernel 310 (e.g., the kernel 131) may include a system resource manager 311 and/or a device driver 312. The system resource manager 311 may include, for example, a process manager (not illustrated), a memory manager (not illustrated), and a file system manager (not illustrated). The system resource manager 311 may perform the control, allocation, recovery, and/or the like of system resources. The device driver 312 may include, for example, a display driver (not illustrated), a camera driver (not illustrated), a Bluetooth driver (not illustrated), a shared memory driver (not illustrated), a USB driver (not illustrated), a keypad driver (not illustrated), a Wi-Fi driver (not illustrated), and/or an audio driver (not illustrated). Also, according to an embodiment of the present disclosure, the device driver 312 may include an Inter-Process Communication (IPC) driver (not illustrated).

The middleware 330 may include multiple modules previously implemented so as to provide a function used in common by the applications 370. Also, the middleware 330 may provide a function to the applications 370 through the API 360 in order to enable the applications 370 to efficiently use limited system resources within the electronic device. For example, as illustrated in FIG. 3, the middleware 330 (e.g., the middleware 132) may include at least one of a runtime library 335, an application manager 341, a window manager 342, a multimedia manager 343, a resource manager 344, a power manager 345, a database manager 346, a package manager 347, a connectivity manager 348, a notification manager 349, a location manager 350, a graphic manager 351, a security manager 352, and any other suitable and/or similar manager.

The runtime library 335 may include, for example, a library module used by a complier, in order to add a new function by using a programming language during the execution of the application 370. According to an embodiment of the present disclosure, the runtime library 335 may perform functions which are related to input and output, the management of a memory, an arithmetic function, and/or the like.

The application manager 341 may manage, for example, a life cycle of at least one of the applications 370. The window manager 342 may manage GUI resources used on the screen. The multimedia manager 343 may detect a format used to reproduce various media files and may encode or decode a media file through a codec appropriate for the relevant format. The resource manager 344 may manage resources, such as a source code, a memory, a storage space, and/or the like of at least one of the applications 370.

The power manager 345 may operate together with a Basic Input/Output System (BIOS), may manage a battery or power, and may provide power information and the like used for an operation. The database manager 346 may manage a database in such a manner as to enable the generation, search and/or change of the database to be used by at least one of the applications 370. The package manager 347 may manage the installation and/or update of an application distributed in the form of a package file.

The connectivity manager 348 may manage a wireless connectivity such as, for example, Wi-Fi and Bluetooth. The notification manager 349 may display or report, to the user, an event such as an arrival message, an appointment, a proximity alarm, and the like in such a manner as not to disturb the user. The location manager 350 may manage location information of the electronic device. The graphic manager 351 may manage a graphic effect, which is to be provided to the user, and/or a user interface related to the graphic effect. The security manager 352 may provide various security functions used for system security, user authentication, and the like. According to an embodiment of the present disclosure, when the electronic device (e.g., the electronic device 100) has a telephone function, the middleware 330 may further include a telephony manager (not illustrated) for managing a voice telephony call function and/or a video telephony call function of the electronic device.

The middleware 330 may generate and use a new middleware module through various functional combinations of the above-described internal element modules. The middleware 330 may provide modules specialized according to types of OSs in order to provide differentiated functions. Also, the middleware 330 may dynamically delete some of the existing elements, or may add new elements. Accordingly, the middleware 330 may omit some of the elements described in the various embodiments of the present disclosure, may further include other elements, or may replace the some of the elements with elements, each of which performs a similar function and has a different name.

The API 360 (e.g., the API 133) is a set of API programming functions, and may be provided with a different configuration according to an OS. In the case of Android or iOS, for example, one API set may be provided to each platform. In the case of Tizen, for example, two or more API sets may be provided to each platform.

The applications 370 (e.g., the applications 134) may include, for example, a preloaded application and/or a third party application. The applications 370 (e.g., the applications 134) may include, for example, a home application 371, a dialer application 372, a Short Message Service (SMS)/Multimedia Message Service (MMS) application 373, an Instant Message (IM) application 374, a browser application 375, a camera application 376, an alarm application 377, a contact application 378, a voice dial application 379, an electronic mail (e-mail) application 380, a calendar application 381, a media player application 382, an album application 383, a clock application 384, and any other suitable and/or similar application.

At least a part of the programming module 300 may be implemented by instructions stored in a non-transitory computer-readable storage medium. When the instructions are executed by one or more processors (e.g., the one or more processors 210), the one or more processors may perform functions corresponding to the instructions. The non-transitory computer-readable storage medium may be, for example, the memory 220. At least a part of the programming module 300 may be implemented (e.g., executed) by, for example, the one or more processors 210. At least a part of the programming module 300 may include, for example, a module, a program, a routine, a set of instructions, and/or a process for performing one or more functions.

Names of the elements of the programming module (e.g., the programming module 300) according to an embodiment of the present disclosure may change depending on the type of OS. The programming module according to an embodiment of the present disclosure may include one or more of the above-described elements. Alternatively, some of the above-described elements may be omitted from the programming module. Alternatively, the programming module may further include additional elements. The operations performed by the programming module or other elements according to an embodiment of the present disclosure may be processed in a sequential method, a parallel method, a repetitive method, or a heuristic method. Also, some of the operations may be omitted, or other operations may be added to the operations.

Hereinafter, it is assumed that an external microphone is connected to an electronic device for the convenience in description; however not only the external microphone but also an internal microphone or a microphone installable in the electronic device can be included. Further, it is assumed that an average gain value obtained from a sound signal is compensated; however not only the average gain value but also various parameters including a sound distortion phenomenon can be included. For example, parameters such as a distortion of frequency, distortion of gain, and/or distortion of time delay can be included.

Figure 4:
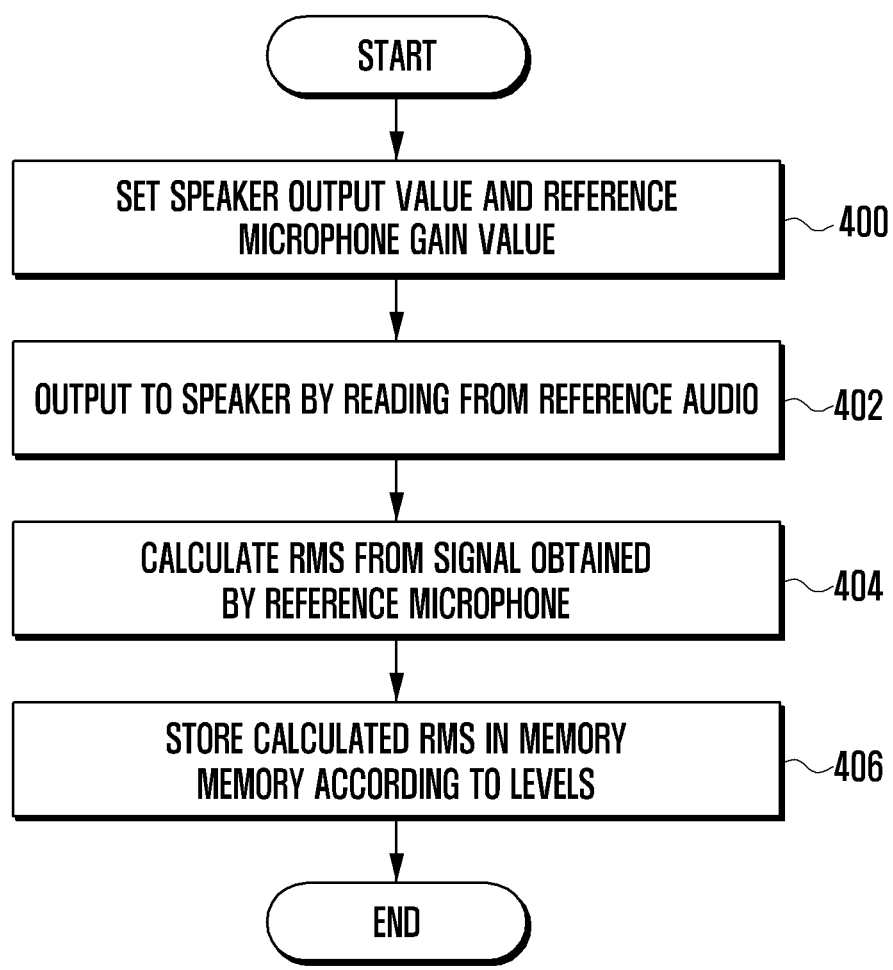
FIG. 4 is a flowchart illustrating a procedure of processing based on a sensitivity of audio signal obtained from an external microphone according to an embodiment of the present disclosure.

FIG. 4 is a flowchart illustrating a procedure of processing based on a sensitivity of audio signal obtained from an external microphone according to an embodiment of the present disclosure.

In the description of FIG. 4, the configuration of block diagram in FIG. 2 is used. However, the block diagram of FIG. 2 illustrates a configuration according to an embodiment of the present disclosure, and therefore it is to be understood to those skilled in the art that not all the components illustrated in FIG. 2 may be used, may further include other components, or some components may be replaced by other components not illustrated in FIG. 2. Further, the electronic device according to the present disclosure can include not only the external device but also a plurality of microphones. The external microphone may use any general connection means such as a 3.5ø jack or a USB connector, which can be applied to the present disclosure in the same method.

The processor 210 sets an output value of the speaker 282 and a gain value of a reference microphone corresponding to an input value set or input by a developer through a user input module or the interface 270 at step 400. The output value of the speaker 282 can be a default output value of the electronic device and the gain value of the reference microphone can be a default gain value of the electronic device.

Subsequently at step 402, the processor 210 controls to output the output value set at step 400 by reading a reference audio stored in the memory 220 or input from the interface 270. Accordingly, the audio codec 280 can convert digital data to an analog signal and transmit the analog signal to the speaker 282. The speaker 282 can output with the output value of the speaker 282 set at step 400 as a volume size.

Like this, the audio signal output by the speaker 282 can be obtained as an analog signal through a reference microphone (not shown). Here, the reference microphone may be a microphone connected to the earphone connector 286 or a microphone connected to a USB connector of the interface 270. Hereafter, for the convenience in description, the reference microphone is assumed to be an external microphone which is connected to the earphone connector 286 through a generally used 3.5ø jack.

An analog signal obtained from the reference microphone connected to the earphone connector 286 is converted to a digital signal by the audio codec 280 and transmitted to the processor 210. Accordingly, the processor 210 can calculate arms (Root Mean Square) from a signal obtained by the reference microphone at step 404. The signal obtained by the reference microphone is converted to a digital signal by the audio codec 280, and thereby the processor 210 can calculate an RMS from the digital signal.

The processor 210 stores the calculated RMS in the memory 220 by levels at step 406. Here, storing the RMS by levels means that the RMS is stored in a predetermined distance unit. For example, the distance displaced from the speaker 282 may be 1 cm, 2 cm, 3 cm, 5 cm, 10 cm, or 15 cm. Accordingly, the control operation of FIG. 4 can be performed several times according to each distance.

Figure 5:
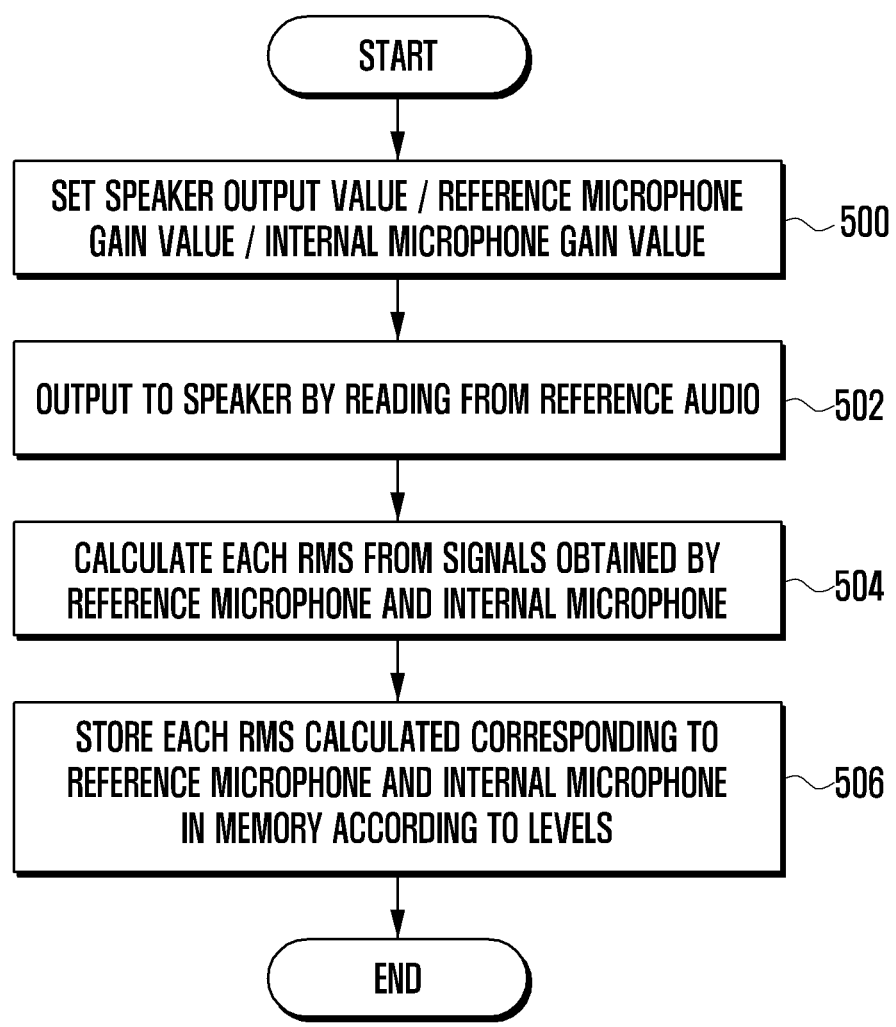
FIG. 5 is a flowchart illustrating a procedure of processing based on a sensitivity of audio signal obtained from an external microphone according to another embodiment of the present disclosure.

FIG. 5 is a flowchart illustrating a procedure of processing based on a sensitivity of audio signal obtained from an external microphone according to another embodiment of the present disclosure.

In the description of FIG. 5, the configuration of block diagram in FIG. 2 is used. However, the block diagram of FIG. 2 illustrates a configuration according to an embodiment of the present disclosure, and therefore it is to be understood to those skilled in the art that not all the components illustrated in FIG. 2 may be used, may further include other components, or some components may be replaced by other components not illustrated in FIG. 2. Further, the electronic device according to the present disclosure can include not only the external device but also a plurality of microphones. The external microphone may use any general connection means such as a 3.5ø jack or a USB connector, which can be applied to the present disclosure in the same method. Further, it is assumed that the microphone of FIG. 2 is an internal microphone.

The processor 210 sets an output value of the speaker 282, a gain value of a reference microphone, and a gain value of the internal microphone 288 corresponding to an input value set or input by a developer through a user input module or the interface 270 at step 500. The output value of the speaker 282 can be a default output value of the electronic device, and the gain value of the reference microphone and the gain value of the internal microphone 288 can be a default gain value of the electronic device.

Subsequently at step 502, the processor 210 controls to output the output value set at step 500 by reading a reference audio stored in the memory 220 or input through the interface 270. Accordingly, the audio codec 280 can convert digital data to an analog signal and transmit the analog signal to the speaker 282. The speaker 282 can output with the output value of the speaker 282 set at step 500 as a volume size.

Like this, the audio signal output by the speaker 282 can be obtained as an analog signal by a reference microphone (not shown). Here, the reference microphone may be a microphone connected to the earphone connector 286 or a microphone connected to a USB connector of the interface 270. Hereafter, for the convenience in description, the reference microphone is assumed to be an external microphone which is connected to the earphone connector 286 through a generally used 3.5ø jack.

An analog signal obtained from the reference microphone connected to the earphone connector 286 is converted to a digital signal by the audio codec 280 and transmitted to the processor 210. Further, an analog signal obtained from the internal microphone 288 is converted to a digital signal by the audio codec 280 and transmitted to the processor 210. Accordingly, the processor 210 can calculate arms from a signal obtained by the reference microphone and another RMS from the signal obtained by the internal microphone 288 at step 404. The signals obtained by the reference microphone and the internal microphone 288 are converted to digital signals by the audio codec 280, and thereby the processor 210 can calculate terms from each digital signal.

The processor 210 stores the calculated RMS in the memory 220 by levels at step 506. Here, storing the RMS by levels means that the RMS is stored in a predetermined distance unit. For example, the distance displaced from the speaker 282 may be 1 cm, 2 cm, 3 cm, 5 cm, 10 cm, or 15 cm. However, the internal microphone 288 has the same distance and thereby only one RMS may be stored. Accordingly, the control operation of FIG. 4 can be performed several times according to each distance and calculation of RMS for the internal microphone may be omitted when calculating another RMS for the following external microphone.

Figure 6:
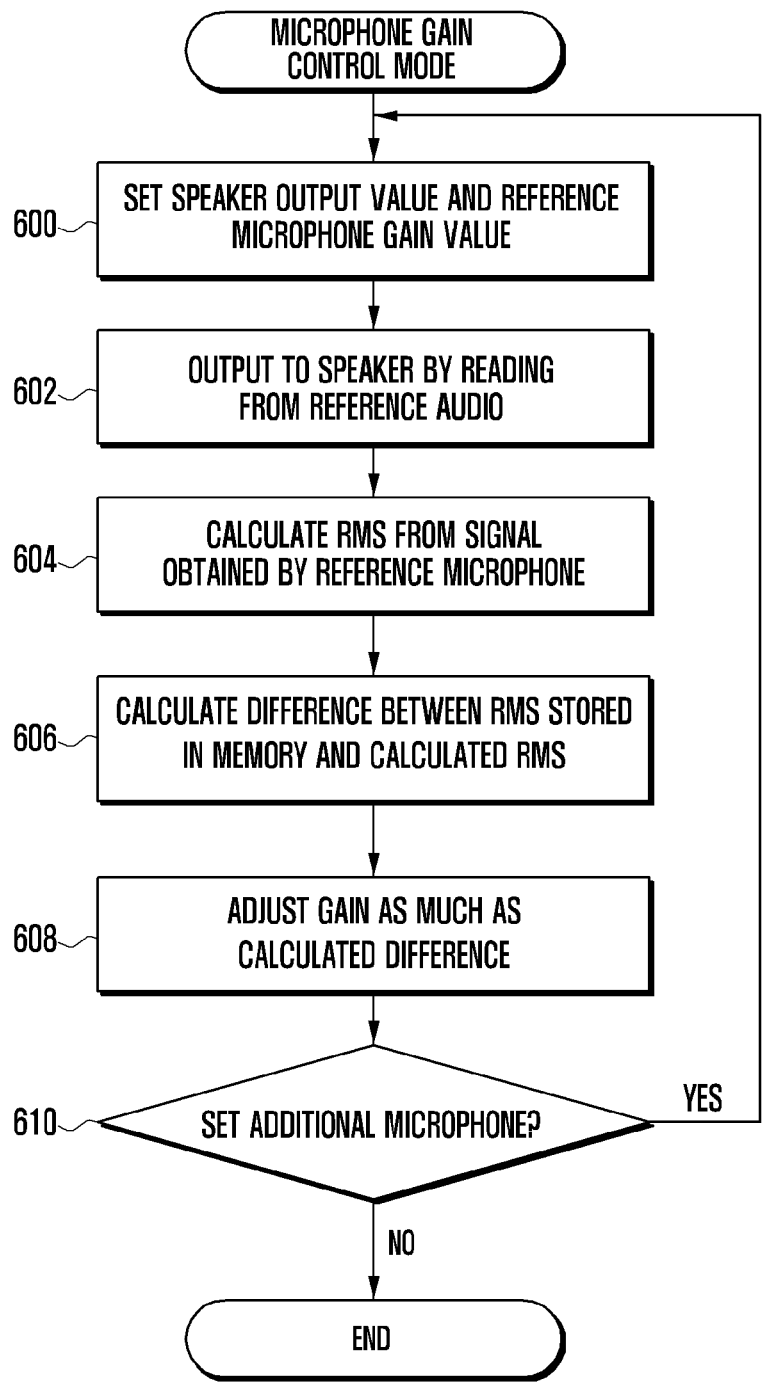
FIG. 6 is a flowchart illustrating a procedure of adjusting a gain based on a sensitivity of audio signal obtained from an external microphone in an electronic device according to an embodiment of the present disclosure.

FIG. 6 is a flowchart illustrating a procedure of adjusting a gain based on a sensitivity of audio signal obtained from an external microphone in an electronic device according to an embodiment of the present disclosure.

In the description of FIG. 6, the configuration of block diagram in FIG. 2 is used. However, the block diagram of FIG. 2 illustrates a configuration according to an embodiment of the present disclosure, and therefore it is to be understood to those skilled in the art that not all the components illustrated in FIG. 2 may be used, may further include other components, or some components may be replaced by other components not illustrated in FIG. 2. Further, the electronic device according to the present disclosure can include not only the external device but also a plurality of microphones. The external microphone may use any general connection means such as a 3.5ø jack or a USB connector, which can be applied to the present disclosure in the same method. Further, it is assumed that the microphone of FIG. 2 is an internal microphone.

If the processor 210 enters a microphone gain adjustment mode, the processor 210 sets an output value of speaker and a gain value of reference microphone at step 600. Here, entering a microphone gain adjustment mode for a microphone can be preset so as to be automatically performed when an application used for processing a sound, such as a sound recording, video recording, and/or telephone conversation, is driven according to a user's request. Alternatively, the entering a microphone gain adjustment mode for a microphone can be performed by asking a user every time when an application used for processing a sound, such as a sound recording, video and/or telephone conversation, is driven. As further another method, the entering a microphone gain adjustment mode of a microphone can be configured so as to be set by a user every time before a corresponding application is driven by the user. Here, information such as a size of reference microphone and a distance between the electronic device and the reference microphone can be predetermined.

Further at step 600, the output value of the speaker can be a default speaker output value and the gain value of the reference microphone can be a default gain value of the electronic device.

Subsequently at step 602, the processor 210 controls to output the output value set at step 600 by reading a reference audio stored in the memory 220. Accordingly, the audio codec 280 can convert digital data to an analog signal and transmit the analog signal to the speaker 282. The speaker 282 then can output with the output value of the speaker 282 set at step 600 as a volume size.

Like this, the audio signal output by the speaker 282 can be obtained as an analog signal by a reference microphone (not shown). Here, the reference microphone may be a microphone connected to the earphone connector 286 or a microphone connected to a USB connector of the interface 270. Hereafter, for the convenience in description, the reference microphone is assumed to be an external microphone which is connected to the earphone connector 286 through a generally used 3.5ø jack.

An analog signal obtained from the reference microphone connected to the earphone connector 286 is converted to a digital signal by the audio codec 280 and transmitted to the processor 210. Accordingly, the processor 210 can calculate arms (Root Mean Square) from a signal obtained by the reference microphone at step 604. The signal obtained by the reference microphone is converted to a digital signal by the audio codec 280, and thereby the processor 210 can calculate an RMS from the digital signal.

At step 606, the processor 210 calculates a difference between an RMS read from the memory 220 and the RMS calculated at step 604. If the RMS is stored by distances (i.e., by levels), the processor 210 reads the RMS by levels and the RMS of reference microphone obtained at step 604 may be an RMS corresponding to a specific distance. For example, data read from the memory 220 may be an RMS of reference microphone stored by distances from the speaker 282. For example, the distance from the speaker 282 may be 1 cm, 2 cm, 3 cm, 5 cm, 10 cm, or 15 cm and the RMS may be stored in the memory 230 corresponding to each distance.

In this case, the distance of reference microphone may need to be predetermined before entering the microphone gain adjustment mode. Here, the value of predetermined distance may be selected from the values of distances stored in the memory 220. Accordingly, if the RMSs have different values corresponding to the distances, the processor 210 can calculate a difference between RMSs (RMS read from the memory and RMS obtained at step 604) corresponding to the same distance at step 606.

However, if the RMSs don't have different values, the processor 210 does not calculate a difference between the RMS read from the memory 220 and the RMS calculated at step 604.

Subsequently at step 608, the processor 210 adjusts a gain of reference microphone as much as the difference calculated at step 606. For example, if the RMS obtained from the reference microphone is greater than the RMS stored in the memory 220, the gain of reference microphone is reduced to the RMS stored in the memory, and if the RMS obtained from the reference microphone is less than the RMS stored in the memory 220, the gain of reference microphone is increased to the RMS stored in the memory. Here, the gain for adjustment may be calculated according to the following equation 1.

$$\text{Gain} = 20\log \sqrt{\frac{\sum_{n=0}^{n-1} y[n]^2}{\sum_{n=0}^{n-1} x[n]^2}} \quad \text{Equation 1}$$

y = Reference Microphone gain (Average RMS)

x = External Microphone gain (Average RMS)

In equation 1, y indicates a reference microphone gain stored in the memory 220 of which value is obtained through the control flow of FIGS. 4 and 5. x indicates an external microphone gain of which RMS is obtained at step 604.

Further, the values of equation 1 may be different according to the distances between the electronic device and the reference microphone; however equation 1 may also be applied by using RMSs of the same distance.

Like this, the adjusted gain value can be stored in the memory 220, and thereafter can be used as a value for adjusting the gain of external microphone when performing a sound recording, video recording, and telephone conversation.

After performing step 608, the processor 210 checks whether setting an additional microphone is necessary at step 610. The necessity of setting an additional microphone may be identified according to a user's request, for example, if a signal informing the necessity of setting an additional microphone is input through the user input module 250. As another example, the necessity of setting an additional microphone can be identified by detecting an additional external microphone being connected to the electronic device. If another external microphone is connected to the 3.5ø jack or to the USB 274, the processor 210 can detect a hardware connection. In this case, step 610 checks whether an additional microphone is connected.

Figure 7:
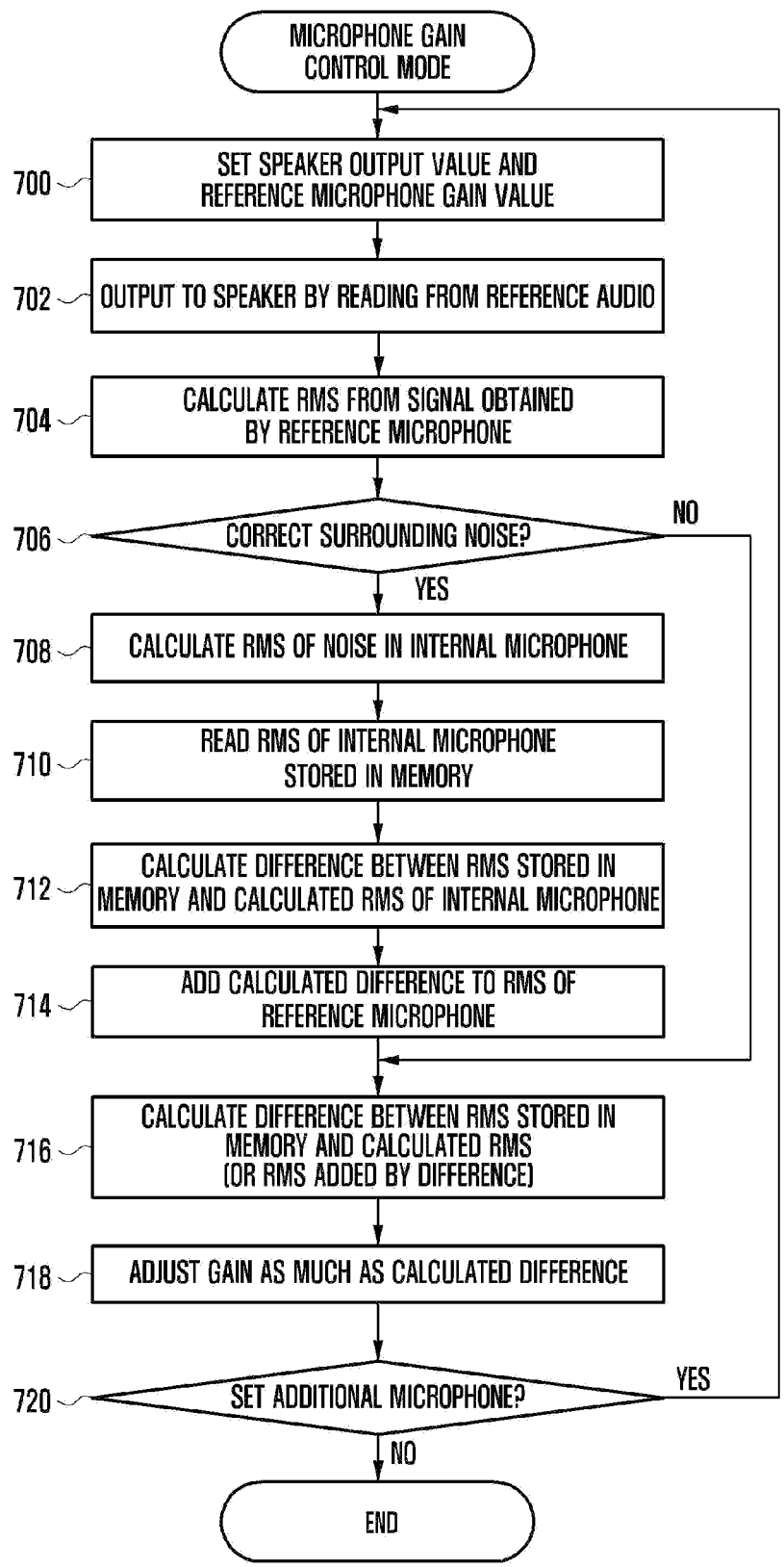
FIG. 7 is a flowchart illustrating a procedure of adjusting a gain based on a sensitivity of audio signal obtained from an external microphone in an electronic device according to another embodiment of the present disclosure.

FIG. 7 is a flowchart illustrating a procedure of adjusting a gain based on a sensitivity of audio signal obtained from an external microphone in an electronic device according to another embodiment of the present disclosure.

In the description of FIG. 7, the configuration of block diagram in FIG. 2 is used and the aforementioned assumption is applied in the same way. The procedure of FIG. 7 is performed in many cases: firstly before recording a sound with an external microphone, secondly before performing a telephone conversation, thirdly before recording a sound while recording a video, and fourthly if an RMS is higher or lower than a predetermined RMS when performing a sound recording, video recording and telephone conversation with an external microphone. According to another embodiment of the present disclosure, in the fourth case, an alarm may be provided in a popup window or a status display line of the display module 260 so that a user can make a selection. The above cases can be applied to FIGS. 5 and 6 in the same manner.

If the processor 210 enters a microphone gain adjustment mode, the processor 210 sets an output value of speaker and a gain value of reference microphone at step 700. Here, entering a microphone gain adjustment mode for a microphone can be preset so as to be automatically performed when an application used for processing a sound, such as a sound recording, video recording, and/or telephone conversation, is driven according to a user's request. Alternatively, the entering a microphone gain adjustment mode for a microphone can be performed by asking a user every time when an application used for performing a sound recording, video recording, and/or telephone conversation is driven. As further another method, the entering a microphone gain adjustment mode for a microphone can be configured so as to be set by a user every time before a corresponding application is driven by the user. Here, information such as a size of reference microphone, distance between the electronic device, and reference microphone can be predetermined.

Further at step 700, the output value of the speaker can be a default speaker output value and the gain value of the reference microphone can be a default gain value of the electronic device.

Subsequently at step 702, the processor 210 controls to output the output value set at step 700 by reading a reference audio stored in the memory 220. Accordingly, the audio codec 280 can convert digital data to an analog signal and transmit the analog signal to the speaker 282. The speaker 282 then can output with the output value of the speaker 282 set at step 600 as a volume size.

Like this, the audio signal output by the speaker 282 can be obtained as an analog signal by a reference microphone (not shown). An analog signal obtained from the reference microphone connected to the earphone connector 286 is converted to a digital signal by the audio codec 280 and transmitted to the processor 210. Accordingly, the processor 210 can calculate an RMS (Root Mean Square) from a signal obtained by the reference microphone at step 704. The signal obtained by the reference microphone is converted to a digital signal by theaudio codec 280, and thereby the processor 210 can calculate an RMS from the digital signal.

Subsequently, the processor 210 checks whether correcting a surrounding noise is necessary at step 706. According to the check result of step 706, the processor 210 proceeds to step 708 if the correcting a surrounding noise is necessary and proceeds to step 716 if the correcting a surrounding noise is unnecessary.

Firstly, step 708 for correcting a surrounding noise is described. The processor controls to obtain a surrounding signal with an electric signal by using the internal microphone 288 at step 708. The obtained electric signal is transmitted to the audio codec 280. The audio codec 280 then converts the electric signal of surrounding noise to a digital signal and sends the digital signal to the processor 210. Accordingly, the processor 210 can receive the surrounding noise obtained by the internal microphone 288 as a digital signal and calculate an RMS from the digital signal at step 708.

After calculating the RMS from the digital signal, the processor 210 reads an RMS of internal microphone 288 stored in the memory 220 at step 710. Subsequently, at step 712, the processor 210 calculates a difference between the RMS stored in the memory 220 and the RMS of the internal microphone 288 calculated at step 708. Here, the RMS of the internal microphone 288 stored in the memory 220 may be an RMS obtained in a noiseless form. Namely, the RMS of the internal microphone 288 stored in the memory 220 may have a value excluding a noise. The processor 210 then proceeds to step 714 and adds the calculated difference at step 712 to the RMS of the reference microphone. Namely, the RMS of the signal obtained from the reference microphone is compensated as much as the difference between the RMS of internal microphone obtained at step 708 and the RMS stored in the memory 220.

For example, when considering a noise, an RMS of surrounding noise obtained from the internal microphone 288 may be different from an RMS stored in the memory 220 in a noiseless form. Therefore, a loss of noise can be compensated by adding such a difference to the RMS obtained from the reference microphone.

Subsequently, the processor 210 proceeds to step 716. There are 2 cases for proceeding to step 716. The first case is that a noise is not corrected and the second case is that a surrounding noise has been corrected.

In the case of not correcting a noise, the processor 210 proceeds from step 706 to step 716. In this case, the processor 210 calculates a difference between the RMS read from the memory 220 and the RMS calculated at step 704. If the RMS is stored by distances (i.e., by levels), the processor 210 reads the RMS by levels and the RMS of the reference microphone obtained at step 604 may be an RMS corresponding to a specific distance. For example, data read from the memory 220 may be an RMS of reference microphone stored by distances from the speaker 282. For example, the distance from the speaker 282 may be 1 cm, 2 cm, 3 cm, 5 cm, 10 cm, or 15 cm and the RMS may be stored in the memory 230 corresponding to each distance.

In this case, the distance of the reference microphone may need to be predetermined before entering the microphone gain adjustment mode. Here, the value of predetermined distance may be one of the distance values stored in the memory 220. Accordingly, if the RMSs have different values corresponding to distances, the processor 210 can calculate a difference between RMSs (RMS read from the memory and RMS obtained at step 704) corresponding to the same distance.

However, if the RMSs don't have different values, the processor 210 can calculate a difference between the RMS read from the memory 220 at step 710 and the RMS calculated at step 704.

Secondly, when considering a surrounding noise (namely, when the processor 210 proceeds from step 714 to step 716), the processor 210 calculates a difference between an RMS read from the memory 220 and the RMS added by the difference at step 714. In more detail, if it is assumed that the RMS obtained at step 704 is A1 and the RMS of the internal microphone stored in the memory 220 is B1, the difference between 2 values C1 becomes"A1-B1". Accordingly, the value output at step 714 becomes "A1+C1". Here, if the RMS stored corresponding to the reference microphone is denoted by D1, the value calculated at step 716 becomes "D1-A1-C1" in the second case.

Further, the calculation at step 716 in the second case may be performed according to levels (i.e., distances) as described above. If the RMS is stored by distances (i.e., by levels), the processor 210 reads the RMS by levels and the RMS of reference microphone obtained at step 604 may be an RMS corresponding to a specific distance.

For example, data read from the memory 220 may be an RMS of the reference microphone stored by distances from the speaker 282. For example, the distance from the speaker 282 may be 1 cm, 2 cm, 3 cm, 5 cm, 10 cm, or 15 cm and the RMS may be stored in the memory 230 corresponding to each distance.

In this case, the distance of reference microphone may be predetermined before entering the microphone gain adjustment mode. Here, the value of predetermined distance may be selected from the distance values stored in the memory 220. Accordingly, if the RMSs have different values corresponding to distances, the processor 210 can calculate a difference between RMSs (RMS read from the memory and RMS obtained at step 604) corresponding to the same distance at step 714.

Subsequently at step 718, the processor 210 adjusts a gain of reference microphone as much as the difference calculated at step 716. For example, if the RMS obtained from the reference microphone is greater than the RMS stored in the memory 220, the gain of the reference microphone is reduced to the RMS stored in the memory, and if the RMS obtained from the reference microphone is less than the RMS stored in the memory 220, the gain of the reference microphone is increased to the RMS stored in the memory. Here, the gain for adjustment may be calculated according to equation 1.

Like this, the adjusted gain value can be stored in the memory 220, and thereafter can be used as a value for adjusting the gain of external microphone when performing a voice recording, sound recording and telephone conversation.

After performing step 718, the processor 210 checks whether setting an additional microphone is necessary at step 720. The necessity of setting an additional microphone may be identified according to a user's request, for example, if a signal informing the necessity of setting an additional microphone is input through the user input module 250. As another example, the necessity of setting an additional microphone can be identified by detecting an additional external microphone being connected to the electronic device. If another external microphone is connected to the 3.5ø jack or to the USB 274, the processor 210 can detect a hardware connection. In this case, step 720 checks whether an additional microphone is connected.

Figure 8:
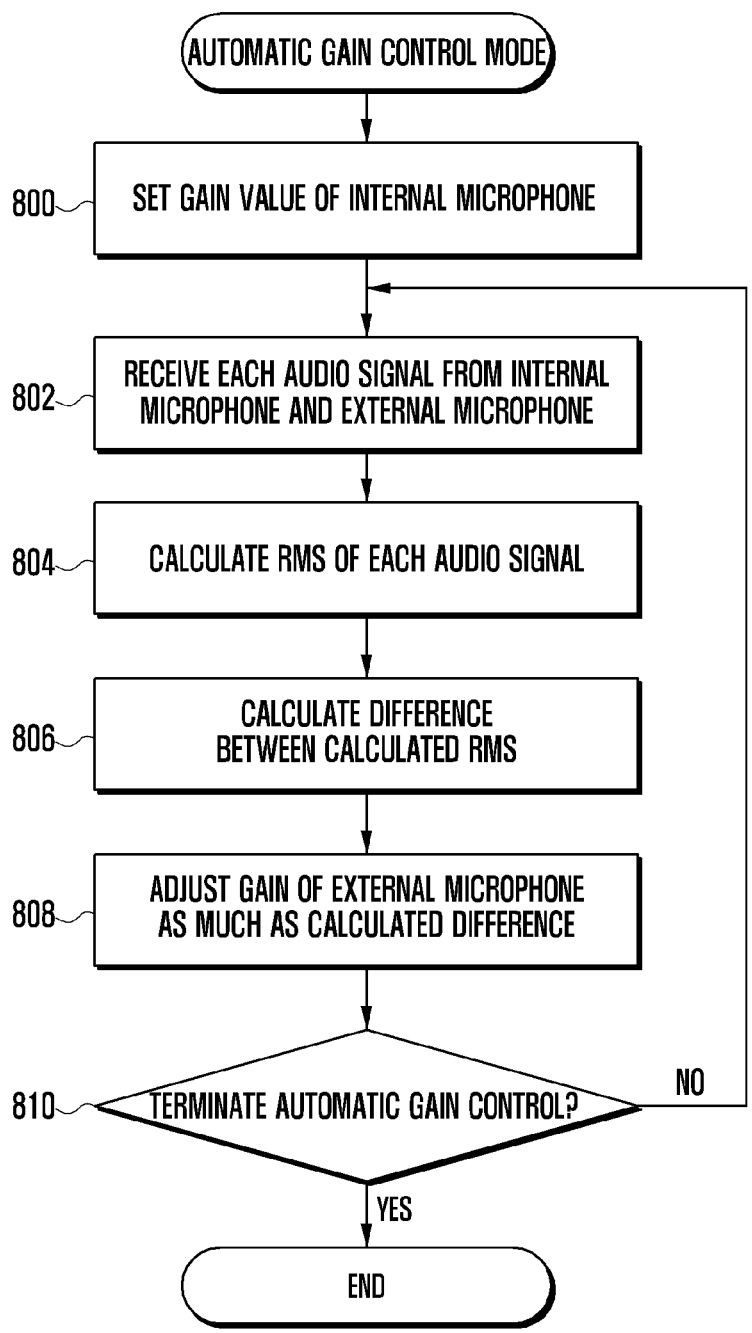
FIG. 8 is a flowchart illustrating a procedure of adjusting a gain based on a sensitivity of audio signal obtained from an external microphone in an electronic device according to further another embodiment of the present disclosure.

FIG. 8 is a flowchart illustrating a procedure of adjusting a gain based on a sensitivity of audio signal obtained from an external microphone in an electronic device according to further another embodiment of the present disclosure.

Referring to FIG. 8, the configuration of block diagram in FIG. 2 is used and the aforementioned assumption is applied in the same manner. The procedure of FIG. 8 is performed in many cases: firstly before recording a sound with an external microphone, secondly before performing a telephone conversation, thirdly before recording a sound while recording a video, and fourthly if an RMS is higher or lower than a predetermined RMS when performing a sound recording, video recording and telephone conversation with an external microphone. According to another embodiment of the present disclosure, in the fourth case, an alarm may be provided in a popup window or a status display line of the display module 260 so that a user can make a selection.

If the processor 210 enters an automatic gain adjustment mode, the processor 210 sets a gain value of internal microphone at step 800. Here, entering an automatic gain adjustment mode for a microphone can be preset so as to be automatically performed when an application used for processing a sound, such as a sound recording, video recording, and/or telephone conversation, is driven according to a user's request. Unlike this, entering a microphone gain adjustment mode of a microphone can be performed by asking a user every time when an application used for processing a sound, such as a sound recording, video recording, and/or telephone conversation, is driven. As further another method, the entering a microphone gain adjustment mode for a microphone can be configured so as to be set by a user every time before a corresponding application is driven by the user. Here, information such as a size of reference microphone, distance between the electronic device, and reference microphone can be predetermined.

Further at step 800, the gain value of the internal microphone 288 can be a default gain value of the electronic device, and if the gain of the internal microphone 288 is set with the default gain value of the electronic device, the gain value of the external microphone can also be set with the default gain value.

Like this, the audio signal output by the speaker 282 can be obtained as an analog signal by a reference microphone (not shown).

Subsequently, the processor 210 receives each audio signal from the internal microphone 288 and the external microphone at step 802, and the audio codec 280 coverts the audio signals received from the internal microphone 288 and the external microphone to digital signals and transmits them to the processor 210. Here, the reference microphone may be a microphone connected to the earphone connector 286 or a microphone connected to a USB connector of the interface 270. Hereafter, for the convenience in description, the reference microphone is assumed to be an external microphone which is connected to the earphone connector 286 through a generally used 3.5ø jack.

The processor 210 calculates RMSs of signals received from the internal microphone 288 and the external microphone at step 804. Subsequently, the processor 210 calculates a difference between the RMS of signal obtained from the internal microphone 288 and the RMS calculated from the signal of the external microphone at step 806.

The audio signals obtained from the internal microphone 288 and the external microphone at step 802 may include a surrounding noise as described in FIG. 7. However, they can be used also when performing a sound recording, video recording, and/or telephone conversation.

Subsequently, the processor 210 adjusts the external microphone gain as much as the calculated difference at step 808. Here, the adjustment of the external microphone gain can be made according to equation 1. If equation 1 is applied, the reference microphone gain (y) may be a gain of internal microphone and the external microphone gain (x) may be a gain of external microphone.

The adjusted gain value may be stored in the memory 220, and thereby can be used as a value for adjusting an external microphone gain when performing a sound recording, video recording, and telephone conversation.

Subsequently, the processor 210 checks whether termination of automatic gain adjustment is requested at step 810. The termination of automatic gain adjustment can be performed when a user requests or the external microphone is disconnected. Like this, the termination of automatic gain adjustment can be performed if a signal informing the termination of automatic gain adjustment is input through the user input module 250 according to the user's request. As another example, the processor 210 can identify whether connection of additional external microphone is released. For example, if an external microphone is pulled out from the 3.5ø jack or another external microphone connected to the USB 274 is pulled out, the processor 210 can detect a release of hardware connection. In this case, the termination of automatic gain adjustment can be detected at step 810.

In an electronic device according to the present disclosure, a gain of voice or sound can be adaptively adjusted according to characteristics of various microphones including an external microphone. Further, the electronic device according to the present disclosure can provide a voice or sound desired by a user by figuring out characteristics of the external microphone, and thereby can improve a quality of sound or voice.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A method for controlling a gain in an electronic device, the method comprising:
   setting an output value of a speaker and a gain value of an external microphone;
   outputting a reference audio to the speaker;
   obtaining a sound signal output by the speaker through the external microphone;
   calculating a root mean square (RMS) value for the obtained sound signal;
   calculating a difference between a pre-stored RMS value and the calculated RMS value; and
   adjusting the gain of the microphone based on the difference between the pre-stored PMS value and the calculated RMS value,
   wherein the pre-stored RMS value includes one or more values obtained according to one or more distances between the electronic device and the external microphone.

2. The method of claim 1, wherein adjusting the gain of the microphone is performed at least one of:
   before recording a sound source with the microphone;
   before performing a telephone communication;
   before recording a sound source with the microphone while recording a video;
   when performing a sound recording, video recording, and telephone communication with the microphone; or
   if a Root Mean Square (RMS) is lower or higher than a tolerance range predetermined from an RMS set while manufacturing the electronic device.

3. The method of claim 1, further comprising:
   providing an alarm when adjusting the gain of the microphone.

4. The method of claim 1, further comprising:
   calculating an RMS value of a surrounding noise through an internal microphone, if correcting a surrounding noise is necessary;
   comparing the RMS value of the surrounding noise with an RMS value of noiseless status pre-stored through the internal microphone; and
   compensating the obtained sound signal from the external microphone according to a result of the comparing.

5. An apparatus for controlling a gain in an electronic device, the apparatus comprising:
   a speaker configured to output a sound;
   an external microphone configured to obtain a sound signal output by the speaker;
   an earphone connector configured to connect the external microphone;
   a memory configured to store a reference audio and at least one root mean square (RMS) value; and
   a processor configured to:
      control to set an output value of the speaker and a gain value of the external microphone;
      control the speaker to output the reference audio;
      control the external microphone to obtain the sound signal from the speaker
      calculate an RMS value for the obtained sound signal;
      calculate a difference between one of the at least one stored RMS value in the memory and the calculated RMS value; and
      adjust the gain of the external microphone based on the difference between the one of the at least one stored RNMS value in the memory and the calculated RMS value,
      wherein the one of the at least one stored RWIS value includes one or more values obtained according to one or more distances between the electronic device and the external microphone.

6. The apparatus of claim 5, wherein adjustment of the gain of the microphone is performed at least one of:
   before recording a sound source with the microphone;
   before performing a telephone communication;
   before recording a sound source with the microphone while recording a video;
   when performing a sound recording, video recording, and telephone communication with the microphone; or
   if a Root Mean Square (RMS) is lower or higher than a tolerance range predetermined from an RMS set while manufacturing the electronic device.

7. The apparatus of claim 4, further comprising:
   an alarm providing device configured to provide an alarm.

8. The apparatus of claim 5, further comprising:
   an internal microphone installed in the electronic device;
   wherein the memory is further configured to store an RMS value of noiseless status, and
   wherein the processor is configured to control to calculate an RMS of a surrounding noise through the internal microphone if correcting a surrounding noise is necessary, compare the RMS value of the surrounding noise with the stored RMS value of the noiseless status through the internal microphone, and to compensate the obtained sound signal from the external microphone according to a result of comparing.

* * * * *